United States Patent
Xu et al.

(10) Patent No.: US 7,230,187 B2
(45) Date of Patent: Jun. 12, 2007

(54) PRINTED WIRE BOARD AND ASSOCIATED MOBILE TERMINAL

(75) Inventors: Liangfeng Xu, Coppell, TX (US); Tommi Reinikainen, Tuusula (FI); Arni Kujala, Espoo (FI); Wei Ren, Frisco, TX (US); Ian Niemi, Inkere (FI); Ilkka Kartio, Tokyo (JP)

(73) Assignee: Nokia Corporation, Espoo (FI)

( * ) Notice: Subject to any disclaimer, the term of this patent is extended or adjusted under 35 U.S.C. 154(b) by 197 days.

(21) Appl. No.: 10/743,527

(22) Filed: Dec. 22, 2003

(65) Prior Publication Data

US 2005/0135072 A1    Jun. 23, 2005

(51) Int. Cl.
*H05K 1/03* (2006.01)

(52) U.S. Cl. .................. 174/255; 174/257; 174/258; 361/748; 361/757; 361/312; 361/313; 361/746; 361/750; 361/751; 361/762; 361/780; 361/794

(58) Field of Classification Search ............ 174/255, 174/257, 258; 361/312, 313, 746, 747, 748, 361/750, 751, 762, 780, 794, 795
See application file for complete search history.

(56) References Cited

U.S. PATENT DOCUMENTS

| | | | |
|---|---|---|---|
| 5,718,039 A * | 2/1998 | Saida et al. ............... 29/846 |
| 5,866,240 A * | 2/1999 | Prabhu et al. .............. 428/210 |
| 6,165,596 A * | 12/2000 | Chen et al. ............... 428/209 |
| 6,343,001 B1 | 1/2002 | Japp et al. ............... 361/306.3 |
| 6,365,839 B1 * | 4/2002 | Robbins et al. ............ 174/255 |
| 6,384,340 B1 * | 5/2002 | Cheng ....................... 174/255 |
| 6,417,460 B1 * | 7/2002 | Cheng ....................... 174/255 |
| 6,489,570 B2 * | 12/2002 | Cheng ....................... 174/255 |
| 6,572,793 B2 * | 6/2003 | Fukui et al. ............. 252/520.2 |
| 6,573,600 B2 * | 6/2003 | Kikuchi et al. ............. 257/750 |
| 6,747,356 B2 * | 6/2004 | Ando et al. ................ 257/758 |
| 2002/0007966 A1 * | 1/2002 | Miller et al. ............... 174/262 |
| 2002/0100608 A1 * | 8/2002 | Fushie et al. .............. 174/255 |
| 2005/0100719 A1 * | 5/2005 | Kanakarajan et al. ....... 428/209 |

FOREIGN PATENT DOCUMENTS

EP    1 261 028 A2    11/2002

OTHER PUBLICATIONS

Takagi et al., "Development of Sequential Build-Up Multilayer Printed Wiring Boards in Japan," *IEEE Electrical Insulation Magazine*, 2003, vol. 19(5), pp. 27-56.
Watanabe et al., "The New Manufacturing Process for Flat-Surface Printed Wiring Boards and the Applications," Proceedings of the Electronic Circuits World Convention, Tokyo, 1999, pp. T4-1-1-T4-1-8.

* cited by examiner

*Primary Examiner*—Tuan T. Dinh
*Assistant Examiner*—Hoa C. Nguyen
(74) *Attorney, Agent, or Firm*—Alston & Bird LLP

(57) ABSTRACT

A multi-layer printed wire board (PWB) structure optimized for improved drop reliability, reliable electrical connections under thermal load, and minimal thickness is provided, along with a mobile terminal, including the PWB. The PWB includes alternating conductive layers and insulative layers. The outermost three layers form an interconnect structure constructed of two conductive layers surrounding an insulative-coated conductive layer. The thicknesses of the various layers are optimized to have an increased resistance to mechanical shock resulting from, for instance, a drop onto a hard surface. In addition, the optimized PWB structure has a minimized thickness and an improved resistance to connection failures resulting from cyclical thermal loads.

18 Claims, 3 Drawing Sheets

FIG. 3

| LAYER | PWB LAYER THICKNESS/MATERIAL |
|---|---|
| COPPER 1 | 35 μm (+15/-10 μm) |
| RCCu 1 | 60 μm (+/-10 μm) RCCu (e.g. Matsushita R0880) |
| COPPER 2 | 35 μm (+15/-10 μm) |
| DIELECTRIC 1 | 75 μm (+/-25 μm) FR-4 (e.g. Matsushita 1766) |
| COPPER 3 | 17 μm (+2/-5 μm) |
| DIELECTRIC 2 | 75 μm (+/-25 μm) FR-4 (e.g. Matsushita 1766) |
| COPPER 4 | 17 μm (+2/-5 μm) |
| DIELECTRIC 3 | 75 μm (+/-25 μm) FR-4 (e.g. Matsushita 1766) |
| COPPER 5 | 17 μm (+2/-5 μm) |
| DIELECTRIC 4 | 75 μm (+/-25 μm) FR-4 (e.g. Matsushita 1766) |
| COPPER 6 | 17 μm (+2/-5 μm) |
| DIELECTRIC 5 | 75 μm (+/-25 μm) FR-4 (e.g. Matsushita 1766) |
| COPPER 7 | 35 μm (+15/-10 μm) |
| RCCu 2 | 60 μm (+/-10 μm) RCCu (e.g. Matsushita R0880) |
| COPPER 8 | 35 μm (+15/-10 μm) |

PRINTED WIRE BOARD AND ASSOCIATED MOBILE TERMINAL

BACKGROUND OF THE INVENTION

1. Field of the Invention

The present invention is related to multi-layer printed wire boards (PWBs), such as for use in electronic devices, and more particularly to multi-layer PWBs for use in mobile terminals.

2. Description of Related Art

Multi-layer printed wire boards (PWBs) are the platform on which complex electronic components such as integrated circuits and a number of passive components, such as capacitors and resistors, are mounted. PWBs serve as a structural foundation and a hub for electrical connections for a variety of electronic devices. Specifically, multi-layer PWBs allow for a plurality of interconnected conductive layers to be packed into a compact space, and as such, they are useful in manufacturing portable electronic devices, including mobile terminals. Multi-layer PWBs must provide not only a compact hub for electrical connections but also a robust mechanical and electrical connection between the electronic components that make up a given device. Of particular interest in portable electronic devices is increasing the drop reliability of the PWB, or the ability of the PWB to maintain a physical and electrical connection between electronic components even after being subjected to the mechanical shock from a drop onto a hard surface, as users of portable electronic devices are unfortunately prone to do.

Originally, drop reliability of multi-layer PWBs was increased by simply increasing the overall thickness and stiffness of the multi-layer PWB. While this solution is effective in securing the mechanical and electrical connections between components on the PWB upon a mechanical shock, it has the negative result of making the miniaturization of the PWB more difficult. In this regard, portable electronic devices are continually being made smaller and, as such, it is desirable that the constituent components, such as the PWB, be similarly made smaller. In addition, thicker and stiffer multi-layer PWBs often suffer from decreased reliability under thermal load, since solder reliability and electrical connectivity under varying thermal load is decreased as the thickness of the multi-layer PWB is increased. This decreased reliability is due in part to the inability of the thick and stiff PWB to flex and conform to the subtly changing sizes and shapes of electrical components and their solder connections during thermal load cycles.

One conventional PWB that is utilized in mobile telephones has eight copper layers separated by dielectric layers or resin coated copper layers. Beginning from one surface of the PWB, a first outermost copper layer is disposed upon a resin coated copper layer which, in turn, is disposed upon a second copper layer. The second copper layer is disposed on a first dielectric layer which, in turn, is disposed on a third copper layer. The third copper layer is disposed upon a second dielectric layer which, in turn, is disposed upon a fourth copper layer. The fourth copper layer is disposed upon a third dielectric layer. The third dielectric layer is centrally located within the PWB and the PWB structure is effectively mirrored about the third dielectric layer. As such, the third dielectric layer is disposed upon a fifth copper layer which, in turn, is disposed upon a fourth dielectric layer. The fourth dielectric layer is disposed upon a sixth copper layer which, in turn, is disposed upon a fifth dielectric layer. The fifth dielectric layer is disposed upon a seventh copper layer which, in turn, is disposed upon a second resin coated copper layer. The second resin coated copper layer is disposed upon an eighth copper layer which forms the opposed surface of the PWB.

Typically, the dielectric layers are formed of a FR-4 glass fiber/epoxy material, such as an FR-4 glass fiber/epoxy material bearing the designation MCL-E-679F provided by Hitachi, Ltd. Additionally, the resin coated copper layers may be formed of a material bearing the designation MCF-6000E that is also provided by Hitachi, Ltd.

The copper layers may be electrically connected by means of vias through the resin coated copper layers and/or the dielectric layers. Based upon the various electrical connections and the components mounted upon the first and eighth copper layers, the PWB can therefore provide the desired functionality.

While this conventional PWB generally performs as desired, this PWB is thicker and stiffer than desired. In this regard, the first, second, seventh and eighth copper layers of a conventional PWB have a thickness between 25 um and 50 um with a nominal thickness of 35 um, while the third, fourth, fifth and sixth copper layers have a thickness of between 12 um and 19 um with a nominal thickness of 17 um. Additionally, the resin coated copper layers of a conventional PWB have a thickness of between 50 um and 70 um with a nominal thickness of 60 um, while each dielectric layer is quite thick and contributes substantially to the overall thickness of the PWB with a thickness between 125 um and 175 um and a nominal thickness of 150 um. In this regard, the thickness of the PWB contributes to the overall size of the mobile terminal and it would therefore be desirable to reduce the size of the PWB and, in turn, the size of the mobile terminal. Additionally, this conventional PWB has not performed as desired in terms of drop reliability. In other words, the PWB has a tendency to no longer function properly after a lesser number of drops than is desired. Since consumers are demanding increased reliability in portable electronic products, it is also desirable to improve the drop reliability of the PWB.

Therefore, it would be advantageous to have an optimized multi-layer PWB structure with an increased mechanical strength and drop reliability, while still maintaining a thin and flexible structure that is compact and less susceptible to connection failure under cyclical thermal loads.

BRIEF SUMMARY OF THE INVENTION

The present invention addresses the above needs by providing an improved PWB multi-layer structure and an associated mobile terminal, that has increased drop reliability and mechanical strength while maintaining an overall thin cross section that is able to withstand cyclical thermal loads without suffering premature failure in its associated electrical connections. The improved PWB structure is composed of a plurality of conductive layers interspersed with insulative layers and selectively-placed insulative-coated conductive layers in which the thicknesses of the respective layers have been optimized to provide a thin overall PWB structure that is both structurally sound when subjected to drop tests, and electrically sound when subjected to cyclical thermal loading.

In one embodiment, the multi-layer PWB structure of the present invention includes a first conductive layer having a thickness between $25\mu$ and $50\mu$. The first conductive layer is disposed upon a first insulative-coated conductive layer that has a thickness between $50\mu$ and $70\mu$. A second conductive layer is disposed upon the first insulative-coated conductive layer and has a thickness between 25μ and 50μ. The second conductive layer is disposed upon a first insulative layer which, in turn, is disposed upon a third conductive layer. The third conductive layer is disposed upon a second insulative layer which, in turn, is disposed upon a fourth conductive layer. The fourth conductive layer is, in turn, disposed upon a third insulative layer. In order to provide the desired improvements in drop reliability and electrically conductivity, the first, second and third insulative layers each have a respective thickness between 50μ and 100μ, and the third and fourth conductive layers each have a respective thickness of between 12μ and 19μ. According to one advantageous embodiment, the first and second conductive layers have a respective nominal thickness of 35μ, the first insulative-coated conductive layer has a nominal thickness of 60μ, each insulative layer has a respective nominal thickness of 75μ and the third and fourth conductive layers have a respective nominal thickness of 17μ.

In one embodiment, the conductive layers are formed of copper and the insulative-coated conductive layer is formed of a resin-coated copper layer. In addition, each insulative layer may comprise a dielectric layer, typically formed of glass fibers in an epoxy matrix. In order to provide the desired electrical connectivity, each insulative-coated conductive layer may define one or more vias between the conductive layers that are disposed on opposite sides thereof. Thus, the respective pair of conductive layers separated by the insulative-coated conductive layer are in electrical communication through the one or more vias defined by the insulative-coated conductive layer. The multi-layer PWB structure may be a symmetrical structure about the third insulative layer. As such, in one embodiment, the third insulative layer is disposed upon a fifth conductive layer which, in turn, is disposed upon a fourth insulative layer. The fourth insulative layer of this embodiment is disposed upon a sixth conductive layer which, in turn, is disposed upon a fifth insulative layer. The fifth insulative layer is disposed upon a seventh conductive layer which, in turn, is disposed upon a second insulative-coated conductive layer. The second insulative-coated conductive layer is disposed upon an eighth conductive layer. In this embodiment, the fifth and sixth conductive layers may each have a respective thickness of between 12μ and 19μ and the fourth and fifth insulative layers may each have a thickness of between 50μ and 100μ. In addition, the seventh and eighth conductive layers may each have a thickness of between 25μ and 50μ and the second insulative coated and conductive layer may have a thickness between 50μ and 70μ in order to optimize the drop reliability and electrical conductivity of the multi-layer PWB of this embodiment of the present invention.

In addition to the multi-layer PWB, a mobile terminal incorporating a multi-layer PWB is also provided according to another aspect of the present invention. The multi-layer PWB and, correspondingly, the mobile terminal of the present invention have many advantages. For example, the PWB structure is optimized to provide a mechanically stable connection between electrical components without the need for an excessively thick or stiff PWB. In addition, the PWB structure is composed of a selection of materials of layer thicknesses that provide a reliable electrical connection between electrical components even under cyclical thermal loads. The combination of thin cross-section and robust mechanical and thermal properties make the PWB of the present invention suited for use in many electronic devices, and particularly well-suited for miniaturized mobile electronic devices, such as mobile terminals including mobile telephones, PDA's, pagers, and the like.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 3 is a table showing the layer thicknesses and tolerances for layer thickness for one embodiment of a multi-layer PWB structure of the present invention.

DETAILED DESCRIPTION OF THE INVENTION

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Figure 1:
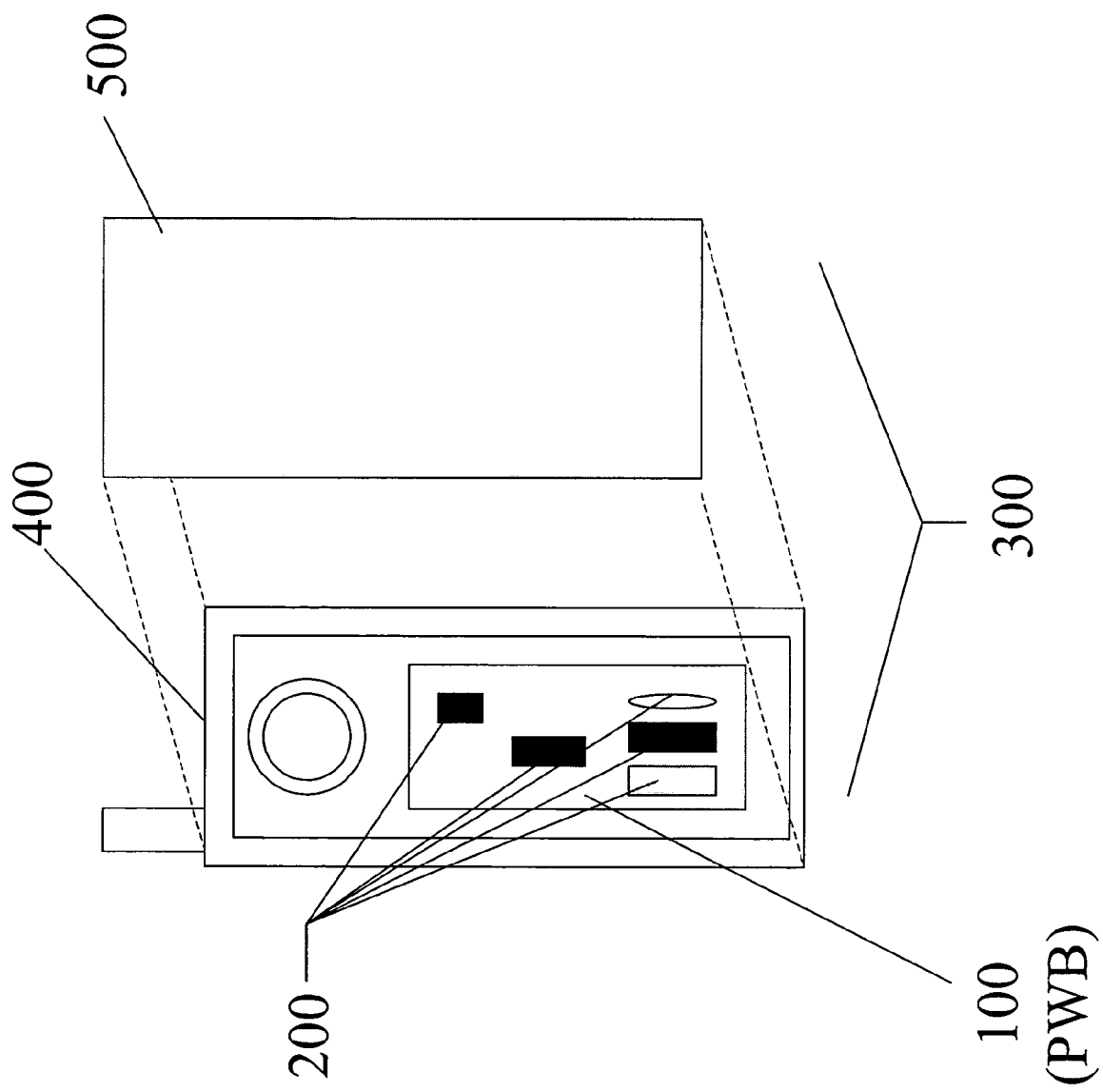
FIG. 1 is a partially-exploded view of a mobile terminal including a multi-layer PWB of the present invention.

A mobile terminal 300, such as a mobile telephone, in accordance with one aspect of the present invention, is shown partially disassembled in FIG. 1. In particular, the front cover 500 of the mobile terminal has been removed to illustrate some of the internal components of the mobile terminal. In this regard, the mobile terminal includes a multi-layer PWB 100 that is shown to be disposed in a housing 400. The multi-layer PWB 100 carries and electrically interconnects a number of electronic components 200, such as integrated circuit(s), microprocessor(s) and passive components, such as capacitors, inductors and resistors. Among these electronic components, the mobile terminal 300 may include and the multi-layer PWB 100 may carry and electrically connect a transmitter and a receiver, sometimes configured as a transceiver, for transmitting and receiving signals, respectively, via a wireless communications system. Although not shown in FIG. 1, the mobile terminal generally includes an EMI shield that effectively shields the plurality of electronic components 200 that are connected to the multi-layer PWB 100, as well as the PWB itself, from electromagnetic interference.

The multi-layer PWB 100 described herein may be used in any electronic device, but is preferably used in a mobile terminal 300. The multi-layer PWB is preferred for such mobile terminals due to its thin cross section, low weight, and improved mechanical soundness as compared to other PWBs which generally exhibit connection failures after a fewer number of drops onto a hard surface. Generally, the mobile terminal 300 discussed herein for use of the multi-layer PWB 100 is a mobile telephone, but such descriptions are illustrative of only one type of mobile terminal that would benefit from the present invention and, therefore, should not be taken to limit the scope of the present invention. For example, other types of mobile terminals, such as portable digital assistants (PDAs), pagers, laptop computers and other types of voice and text communications systems, can readily employ the present invention. Moreover, the system and method of the present invention will be primarily described in conjunction with mobile communications applications. But the system and method of the present invention can be utilized in conjunction with a variety of other applications, both in the mobile communications industries and outside of the mobile communications industries.

Figure 2:
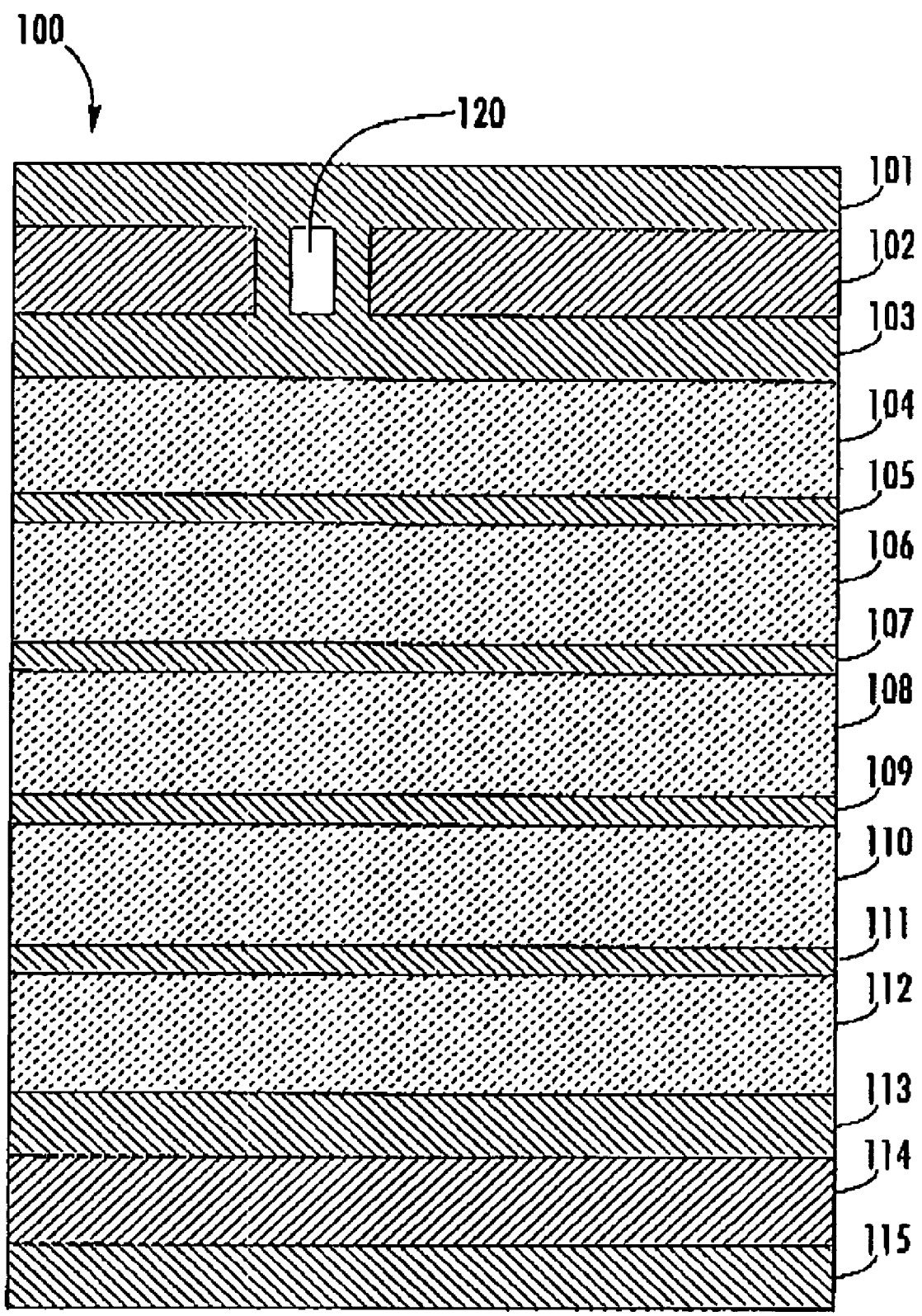
FIG. 2 is a side view of an embodiment of a PWB multi-layer structure of the present invention showing relative thicknesses of the adjacent layers.

FIG. 2 shows a cross-section of the layers which make up the PWB 100 of one embodiment of the present invention. The PWB of this embodiment includes a third insulative layer 108 that is typically comprised of a dielectric laminate and is sandwiched between the fourth conductive layer 107 and the fifth conductive layer 109. The three layers are further sandwiched between the second insulative layer 106 and the fourth insulative layer 110, both of which are also typically comprised of dielectric laminates. A third conductive layer 105 is typically disposed upon the second insulative layer 106, opposite the fourth conductive layer 107, and a sixth conductive layer 111 is generally disposed upon the fourth insulative layer 110, opposite the fifth conductive layer 109. The PWB 100 of the illustrated embodiment also includes a first insulative layer 104 disposed upon the third conductive layer 105, opposite the second insulative layer 106, and a fifth insulative layer 112 disposed upon the sixth conductive layer 111, opposite the fourth insulative layer 110. As before, the first and fifth insulative layers 104, 112 are typically comprised of dielectric laminates.

A respective interconnect structure comprised of a pair of conductive layers disposed on opposite surfaces of a insulative-coated conductive layer is disposed upon each of the first and fifth insulative layers 104, 112, opposite the third and sixth conductive layers 105, 111, respectively. In this regard, a first interconnect structure comprised of first and second conductive layers 101, 103 positioned on opposed surfaces of a first insulative-coated conductive layer 102 may be disposed upon the first insulative layer 104, while a second interconnect structure comprised of seventh and eighth conductive layers 113, 115 positioned on opposed surfaces of a second insulative-coated conductive layer 114 may be disposed on the fifth insulative layer 112.

As used herein, reference to one layer being disposed upon another layer is not intended to connote a particular positional relationship, such as one layer being "on" another layer, and is also not intended to connote that one layer is immediately adjacent another layer. Instead, the layers may be separated by one or more intervening layers.

As described, the PWB 100 of the illustrated embodiment is symmetrical relative to the third insulative layer 108 with a first set of layers between and including the first conductive layer 101 and the third insulative layer 108 being identical in material and thickness to a second set of layers between and including the third insulative layer 108 and the eight conductive layer 115. If this symmetrical structure is not necessary, the PWB 100 of another embodiment need only include one set of layers in order to further thin the PWB 100.

In one embodiment of the multi-layer PWB structure 100 described above, each insulative layer 104, 106, 108, 110, 112 is comprised of the same type of dielectric laminate, namely, an FR-4 material comprised of glass fibers in an epoxy matrix. For example, the insulative layers may be comprised of an FR-4 glass/epoxy material provided by Matsushita Electric Industrial Company, Ltd. (hereinafter Matsushita) bearing product number 1766. Additionally, the insulative-coated conductive layers 102, 114 may be formed of resin coated copper, i.e., RCCu, such as that provided by Matsushita bearing product number R0880. Further, the conductive layers 101, 103, 105, 107, 109, 111, 113, 115 may be formed of the same material, such as copper.

The particular thickness of each layer including both its nominal thickness and its tolerance is significant to provide a relatively thin PWB 100 that has improved drop reliability and that mains electrical connectivity during thermal cycling. In this regard, the preferred dimensions and tolerances for one advantageous embodiment of the present invention are presented in the table of FIG. 3. The preferred thickness dimensions and tolerances for each layer in this embodiment are as follows: (1) all insulative layers 104, 106, 108, 110, 112: 75 um+/−25 um, (2) third, fourth, fifth, and sixth copper conductive layers 105, 107, 109, 111: 17 um+2/−5 um, (3) first, second, seventh and eighth conductive layers 101, 103, 113, 115: 35 um+15/−10 um, and (4) all insulative-coated conductive layers 102, 114: 60 um+/−10 um. As such, the layers of the inventive PWB 100 are thinner than a conventional PWB, with the particular combination of layer thicknesses chosen to optimize drop reliability and electrical connectivity during thermal cycling while thinning the PWB.

The conductive layers of each interconnect structure are generally electrically connected in a predefined manner through vias 120 defined by the insulative-coated conductive layers 102, 114. In this regard, the vias 120 may be defined, such as by micro-drilling, between the respective conductive layers and the sidewalls of the vias may be electro-plated with a conductive material, such as copper, to establish an electrical connection between the conductive layers. For example, as shown in FIG. 2, the first and second conductive layers 101, 103 may be selectively connected by means of plated-through vias 120 defined by the first insulative-coated conductive layer 102. Similarly, the seventh and eighth 113, 115 conductive layers may be selectively connected by means of plated-through vias 120 defined by the second insulative-coated conductive layer 114. Likewise, the third, fourth, fifth and sixth conductive layers 105, 107, 109, 111 may be selectively interconnected to one another and/or to the first, second, seventh and eighth conductive layers by vias 120 defined through the respective insulative layers as known to those skilled in the art.

As noted above, the insulative layers that contribute substantially to the overall thickness of the PWB 100 are much thinner, such as by 50%, than corresponding insulative layers of a conventional PWB. In addition, the third, fourth, fifth and sixth conductive layers 105, 107, 109, 111 are advantageously thinner, such as by about 50%, than the first, second, seventh and eighth layers 101, 103, 113, 115 that comprise respective interconnect structures. Thus, the thinner insulative layers and the interior conductive layers facilitate the thinning and flexibility of the PWB 100, while the thicker conductive layers of the interconnect structures provide the desired reliability in electrical connectivity.

The multi-layer PWB 100 of the present invention can be constructed with conventional techniques of printed wire board construction. For example, the conductive layers may be electrodeposited as a thin foil upon a respective insulative layer or insulative-coated conductive layer. This electrodeposited foil may then be marked and chemically etched to the desired pattern as known to those skilled in the art. Additionally, once the layers have been appropriately stacked, the layers may be consolidated or integrated by press lamination or the like. Thereafter, the resulting PWB structure 100 can be cut into any shape to fit properly within the electronic device, such as a mobile terminal 300 for which it was designed.

By properly designing the thickness and composition of the respective layers, the resulting PWB 100 has improved drop reliability. In this regard, the PWB of the embodiment depicted in FIGS. 2 and 3 has a drop reliability, as determined by the JEDEC Standard Test Method B 104-A Mechanical Shock Test, that is ten times better than the drop reliability of the conventional PWB described in the background section. In other words, the PWB of FIGS. 2 and 3 may be dropped ten times more, on average, than the conventional PWB described in the background section before suffering the same predefined number of defects that is considered to render the PWB non-functional.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A multi-layer printed wire board structure, comprising:
   a first conductive layer having a thickness between 25 and 50 um;
   a first insulative-coated conductive layer upon which said first conductive layer is disposed, wherein said first insulative-coated conductive layer has a thickness between 50 and 70 um;
   a second conductive layer upon which said first insulative-coated conductive layer is disposed, wherein said second conductive layer has a thickness between 25 and 50 um;
   a first insulative layer upon which said second conductive layer is disposed, wherein the first insulative layer has a thickness between 50 and 100 um;
   a third conductive layer upon which said first insulative layer is disposed, wherein the third conductive layer has a thickness between 12 and 19 um and wherein said third conductive layer is at least about 50 percent thinner than said first conductive layer and said second conductive layer; and
   a second insulative layer upon which said third conductive layer is disposed wherein the second insulative layer has a thickness between 50 and 100 um.

2. The multi-layer printed wire board structure of claim 1 further comprising:
   a fourth conductive layer upon which said second insulative is disposed, wherein the fourth conductive layer has a thickness of 12 and 19 um and wherein said fourth conductive layer is at least about 50 percent thinner than said first conductive layer and said second conductive layer; and;
   a third insulative layer upon which said fourth conductive layer is disposed, wherein the third insulative layer has a thickness between 50 and 100 um.

3. The multi-layer printed wire board structure of claim 1 further comprising:
   a fifth conductive layer upon which said third insulative layer is disposed, wherein said fifth copper layer has a thickness between 12 and 19 um and wherein said fifth conductive layer is at least about 50 percent thinner than said first conductive layer and said second conductive layer;
   a fourth insulative layer upon which said fifth conductive layer is disposed, wherein said fourth insulative layer has a thickness between 50 and 100 um;
   a sixth conductive layer upon which said fourth insulative layer is disposed wherein said sixth conductive layer has a thickness between 12 and 19 um and wherein said sixth conductive layer is at least about 50 percent thinner than said first conductive layer and said second conductive layer;
   a fifth insulative layer upon which said sixth conductive layer is disposed, wherein said fifth insulative layer has a thickness between 50 and 100 um;
   a seventh conductive layer upon which said fifth insulative layer is disposed, wherein said seventh conductive layer has a thickness between 25 and 50 um;
   a second insulative-coated conductive layer upon which said seventh conductive layer is disposed, wherein said second insulative-coated conductive layer has a thickness between 50 and 70 um; and
   an eighth conductive layer upon which said second insulative-coated conductive layer is disposed, wherein said eighth conductive layer has a thickness between 25 and 50 um.

4. The multi-layer printed wire board structure of claim 1, wherein said first and second conductive layers has a respective nominal thickness of 35 um; said first insulative-coated conductive layer has a nominal thickness of 60 um; said third conductive layer has a nominal thickness of 17 um; and each insulative layer has a respective nominal thickness of 75 um.

5. The multi-layer printed wire board structure of claim 1, wherein said first and second conductive layers are formed of copper.

6. The multi-layer printed wire board structure of claim 1, wherein said first insulative-coated conductive layer comprises a resin-coated copper layer.

7. The multi-layer printed wire board structure of claim 1, wherein each insulative layer comprises a dielectric layer.

8. The multi-layer printed wire board structure of claim 7, wherein each insulative layer is formed of glass fibers and an epoxy matrix.

9. The multi-layer printed wire board structure of claim 1 wherein said first insulative-coated conductive layer defines at least one via between said first and second conductive layers such that said first and second conductive layers are in electrical communication through the at least one via.

10. The mobile terminal of claim 9, wherein said first and second conductive layers has a respective nominal thickness of 35 um; said first insulative-coated conductive layer has a nominal thickness of 60 um; said third conductive layer has a nominal thickness of 17 um; and each insulative layer has a respective nominal thickness of 75 um.

11. The mobile terminal of claim 9, wherein said first and second conductive layers are formed of copper.

12. A mobile terminal comprising:
    a transmitter and receiver for transmitting and receiving signals, respectively, via a wireless communications system; and
    a multi-layer printed wire board structure in electrical communication with said transmitter and receiver, the structure comprising:
       a first conductive layer having a thickness between 25 and 50 um;
       a first insulative-coated conductive layer upon which said first conductive layer is disposed, wherein said first insulative-coated conductive layer has a thickness between 50 and 70 um;

a second conductive layer upon which said first insulative-coated conductive layer is disposed, wherein said second conductive layer has a thickness between 25 and 50 um;

a first insulative layer upon which said second conductive layer is disposed, wherein the first insulative layer has a thickness between 50 and 100 um;

a third conductive layer upon which said first insulative layer is disposed, wherein the third conductive layer has a thickness between 12 and 19 um and wherein said third conductive layer is at least about 50 percent thinner than said first conductive layer and said second conductive layer; and a second insulative layer upon which said third conductive layer is disposed wherein the second insulative layer has a thickness between 50 and 100 um.

13. The mobile terminal of claim 12 further comprising:

a fourth conductive layer upon which said second insulative is disposed, wherein the fourth conductive layer has a thickness of 12 and 19 um and wherein said fourth conductive layer is at least about 50 percent thinner than said first conductive layer and said second conductive layer; and a third insulative layer upon which said fourth conductive layer is disposed, wherein the third insulative layer has a thickness between 50 and 100 um.

14. The mobile terminal of claim 13 wherein said multilayer printed wire board structure further comprises:

a fifth conductive layer upon which said third insulative layer is disposed, wherein said fifth copper layer has a thickness between 12 and 19 um and wherein said fifth conductive layer is at least about 50 percent thinner than said first conductive layer and said second conductive layer;

a fourth insulative layer upon which said fifth conductive layer is disposed, wherein said fourth insulative layer has a thickness between 50 and 100 um;

a sixth conductive layer upon which said fourth insulative layer is disposed wherein said sixth conductive layer has a thickness between 12 and 19 um and wherein said sixth conductive layer is at least about 50 percent thinner than said first conductive layer and said second conductive layer;

a fifth insulative layer upon which said sixth conductive layer is disposed, wherein said fifth insulative layer has a thickness between 50 and 100 um;

a seventh conductive layer upon which said fifth insulative layer is disposed, wherein said seventh conductive layer has a thickness between 25 and 50 um;

a second insulative-coated conductive layer upon which said seventh conductive layer is disposed, wherein said second insulative-coated conductive layer has a thickness between 50 and 70 um; and an eighth conductive layer upon which said second insulative-coated conductive layer is disposed, wherein said eighth conductive layer has a thickness between 25 and 50 um.

15. The mobile terminal of claim 12, wherein said first insulative-coated conductive layer comprises a resin-coated copper layer.

16. The mobile terminal of claim 12, wherein each insulative layer comprises a dielectric layer.

17. The mobile terminal of claim 16, wherein each insulative layer is formed of glass fibers and an epoxy matrix.

18. The mobile terminal of claim 12 wherein said first insulative-coated conductive layer defines at least one via between said first and second conductive layers such that said first and second conductive layers are in electrical communication through the at least one via.

* * * * *